(12) United States Patent
Miki et al.

(10) Patent No.: US 6,552,939 B1
(45) Date of Patent: Apr. 22, 2003

(54) SEMICONDUCTOR MEMORY DEVICE HAVING DISTURB TEST CIRCUIT

(75) Inventors: Takeo Miki, Tokyo (JP); Kiyohiro Furutani, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/976,116

(22) Filed: Oct. 15, 2001

(51) Int. Cl.[7] .................. G11C 29/00; G11C 7/00
(52) U.S. Cl. ............... 365/200; 365/201; 365/185.09
(58) Field of Search ................. 365/200, 201, 365/185.09

(56) References Cited

U.S. PATENT DOCUMENTS 5,327,382 A    7/1994  Seno et al. .............. 365/210
5,381,371 A  * 1/1995  Haraguchi ............... 365/200
6,118,710 A    9/2000  Tsuji ...................... 365/200
6,285,620 B1 * 9/2001  Ho et al. ................. 365/200
6,353,562 B2 * 3/2002  Bohm et al. ............. 365/200

FOREIGN PATENT DOCUMENTS

JP      7-29394      1/1995
JP      11-353893   12/1999

* cited by examiner

Primary Examiner—David Nelms
Assistant Examiner—Tu-Tu Ho
(74) Attorney, Agent, or Firm—McDermott, Will & Emery

(57) ABSTRACT

In a semiconductor memory device having normal circuit blocks (NBL) and a redundant circuit block (RBL) for replacement, a test mode setting unit (14, 19) sets a spare non-selection mode (TMSPROFF) and enables to restore an original address of a normal circuit (DE) in a state before executing a replacement to thereby implement a disturb test even after the replacement.

4 Claims, 8 Drawing Sheets

SEMICONDUCTOR MEMORY DEVICE HAVING DISTURB TEST CIRCUIT

BACKGROUND OF THE INVENTION

1. Field of the Invention

The present invention generally relates to a semiconductor memory device, and in particular to a disturb test system using a flexible redundancy technique for a high-density semiconductor memory device and the like semiconductor integrated circuit having a redundant construction.

2. Description of the Prior Art

In a conventional semiconductor memory device, in order to improve a yield or recovery, when there exists a defect in the memory device, the defective element is repaired by replacement with a correct element of a redundant circuit, using such as a laser trimming method. Therefore, the memory device per se must be previously provided with a redundant circuit block.

FIG. 8 shows an example of a conventional memory cell array construction of a redundant distribution type. In the construction of this type, the memory cell array is comprised of a plurality of memory sub array blocks (SAB0 to SAB3). The sub array blocks include corresponding normal blocks (NBL0 to NBL3) and corresponding redundant blocks (RBL0 to RBL3) which are controlled upon receipt of address selection signals from corresponding program circuits (PRO0 to PRO3). Each of the normal blocks is formed of normal memory cells and each of the redundant blocks is formed of redundant cells.

In recent years, in order to improve a yield with reduction in chip area, there is developed a flexible redundancy construction of a shared redundancy type as shown in FIG. 9. In this construction, a plurality of redundant blocks are concentrated as one redundant block RBL located in one particular memory sub array block (e.g., SAB2 in FIG. 9) and replacement of a defect element in a normal block in one memory sub array is executed using a redundant element provided in the redundant block.

When a redundant element is to be used, a corresponding spare word line enable signal SWLE is activated and a corresponding normal word line enable signal NWLE is inactivated. On the contrary, when a redundant element is not to be used, a spare word line enable signal SWLE is inactivated and a corresponding normal word line enable signal NWLE is activated.

In a usual redundant replacement, selection of using a redundant element in place of a normal defective element is executed by a known technique of blowing a fuse in a laser trimmer for electrically melting a non-use fuse and connecting another fuse to be used in a program circuit, thereby controlling the selection of a redundant circuit in accordance with an address to be replaced.

Thus, in the conventional semiconductor memory device, repair efficiency is enhanced and the occurrence of a defective product is prevented by replacement of a defect element with a redundant element over different sub arrays SAB0 to SAB3 as shown in FIG. 9.

On the other hand, a disturb refresh test for a semiconductor memory device is carried out for examining a storage state of the memory cell. In the disturb refresh test, a reading operation of a word line of interest is repeated, that is, the word line of interest is repeatedly turned on/off for a predetermined period to create a situation where a leakage is easily caused in a memory cell in the vicinity of the word line of interest. In this manner, the storage state of the memory cell is tested.

However, in a flexible type redundant configuration as shown in FIG. 9, a defective element included in one normal sub array block may be replaced with a redundant element included in another sub array block in many cases. Therefore, there is a problem that a defective portion can not be detected or detection ability of a defective portion is undesirably lowered because of the following reasons as to be described below.

FIG. 10 shows an example of a general memory cell array construction of a dynamic random access memory (referred to "DRAM" hereinafter). In this construction, a plurality of sense amplifiers (S/A0, . . . , S/A3) are connected to corresponding bit line pairs (Bit #0, /Bit #0, . . . , Bit #3, /Bit #3), respectively, and each of the bit lines has a plurality of activation regions through bit line contacts BLC. The memory cell array further includes a plurality of word lines (WL0 to WL8) so that interest storage nodes SN of the memory cells are designated by the bit lines and the word lines.

The following describes a case where there is a leakage or short-circuit due to such as an electrically conductive foreign or extraneous substance or dusts between a storage node of a cell A and a storage node of an adjacent cell B.

In the case where an address of the adjacent cell B sharing a bit line contact hole BLC3 with the cell A is replaced by an address of a redundant circuit, namely, in the case where, for example, a word line WL3 having a defect is replaced by a redundant circuit, the word line WL3 of an adjacent address can not be activated after the replacement is executed. Therefore, reverse data with respect to data stored in the cell A can not be stored in the adjacent bit cell B which is short-circuited to the cell A by the leakage.

As a result, even when there exists a leakage between the cell A and the adjacent cell B, the defective portion can not be fully detected in a disturb refresh test once the replacement was executed.

This is because, in a usual replacement, the selection of a redundant sub array block in place of a normal sub array block is executed by blowing a fuse, using a laser trimming technique for electrically melting a fuse in the program circuit. Thus, the program circuit controls the redundant circuit in accordance with an address of a defective element to be replaced. However, once such replacement with a redundant circuit is carried out, the fuse connection state in the program circuit can not be immediately restored to the previous or original state. Accordingly, the word line of interest for selecting the defective cell B can not be activated after the replacement was carried out. Therefore, the adjacent cell B short-circuited to the cell A can not be written with the reverse data with respect to the data written in the cell A.

Referring to FIG. 11, the following describes a case where there is a short-circuit between a storage node of the cell A and an adjacent bit line (e.g., Bit 2 in FIG. 11) due to such as a conductive foreign substance or dusts.

In order to detect this defect, data of high level "H" has been previously written in the cell A and then the level of the adjacent bit line Bit 2 is made low "L" in the disturb refresh test. In this case, since the level of the bit line must be changed under the condition that the cell A is kept in the non-selected state, the level of the bit line is changed by a sense operation in the manner same as that when accessing the cell data within the same sub array block.

Therefore, in the case of the redundancy distribution type where the redundant circuit used for replacement is located in the same sub array block of the normal block as shown in FIG. 8, the bit line level of interest can be determined. However, in the case of the flexible type redundancy construction as shown in FIG. 9, when the word line is replaced by a redundant circuit located in a sub array block other than that of the word line WL4 selecting the cell A, the redundant block RBL is kept in the non-selected condition unless the word line WL4 is selected. Therefore, this block is set to be a stand-by state. That is, in the stand-by condition, the level is generally equalized to ½ VDDS level which corresponds to a power supply level for a sense amplifier (S/A#0 to S/A#3). Therefore, the disturb refresh test can not be fully executed for detecting a defective portion.

Also, in the case where a part of other than the word line WL4 is replaced by a redundant circuit of a different sub array block, the frequency of accessing the bit line is lowered, and therefore the disturb refresh test can not be fully executed. Therefore, there is a problem that it takes more test time needed to detect a defective portion due to increase of the disturb time and the speed of the disturb test is deteriorated.

SUMMARY OF THE INVENTION

An essential object of the present invention is to solve the above described problem and to provide a semiconductor memory device capable of fully executing a disturb test for detecting a defective portion even after replacement is carried out.

Further, it is another object to provide a method of detecting a defective portion in a semiconductor memory device by an optional bit line level.

According to a first aspect of the present invention, a semiconductor memory device having normal circuit blocks and a redundant circuit block for replacement, comprises: a test mode executing unit for enabling to restore an original address of a normal circuit in a state before executing a replacement.

By this arrangement, a disturb test can be fully implemented even after the replacement was carried out.

In this construction, the test mode executing unit may set a spare non-selection mode for prohibiting usage of a redundant circuit.

The semiconductor memory device may further comprise a determining unit for determining use/non-use of redundancy in response to an address signal.

The test mode executing unit may include a test mode detecting unit for detecting designation of a particular test mode in response to a test mode designation signal.

The semiconductor memory device may further include a logical circuit means for selecting both a spare row address for a replacement destination of a redundant circuit and an original row address of a replaced normal circuit in an activated state.

Thus, the disturb test can be implemented both in the normal address selection mode and the spare address s election mode even after the replacement is carried out. By this arrangement the previous address of the original element DE and the replaced redundant element RE can be both activated so that the defective portion of such as a memory cell adjacent to the original element DE can be both detected even after executing the replacement. By this arrangement the disturb test time can be remarkably suppressed.

According to a second aspect of the present invention, a semiconductor memory device having normal circuit blocks and a redundant circuit block for replacement, comprises: a bit line voltage force mode setting unit for determining a voltage potential of a bit line of interest while a corresponding word line is kept in an off-state; and a write driver for determining the bit line level in voltage potential based on column select line signals.

According to a third aspect of the present invention, there is provided a met hod of detecting a defect in a semiconductor memory device having normal circuit blocks and a redundant circuit block for replacement. The method comprises the steps of: writing expected data in a subject memory cell of interest; applying the bit line voltage force mode signal to a write driver to enter a particular test mode; inactivating sense amplifiers base on a sense amplifier enable signal of "L" level; and determining the level of the bit line of interest in accordance with the output signals of the write driver, wherein the level of the bit line is determined in a manner such that the adjacent memory cell is written with reverse data with respect to the data in the subject memory cell.

By this arrangement, the defect can be detected in the disturb test in the particular test mode, and it becomes possible to apply reverse data to both sides of the bit line pair with respect to the subject memory cell

BRIEF DESCRIPTION OF THE DRAWINGS

These and other objects and features of the present invention will be readily understood from the following detailed description taken in conjunction with preferred embodiments thereof with reference to the accompanying drawings, in which like parts are designated by like reference numerals and in which.

DESCRIPTION OF THE PREFERRED EMBODIMENTS

The following describes preferred embodiments of the present invention with reference to the accompanying drawings.

Embodiment 1

Figure 1:
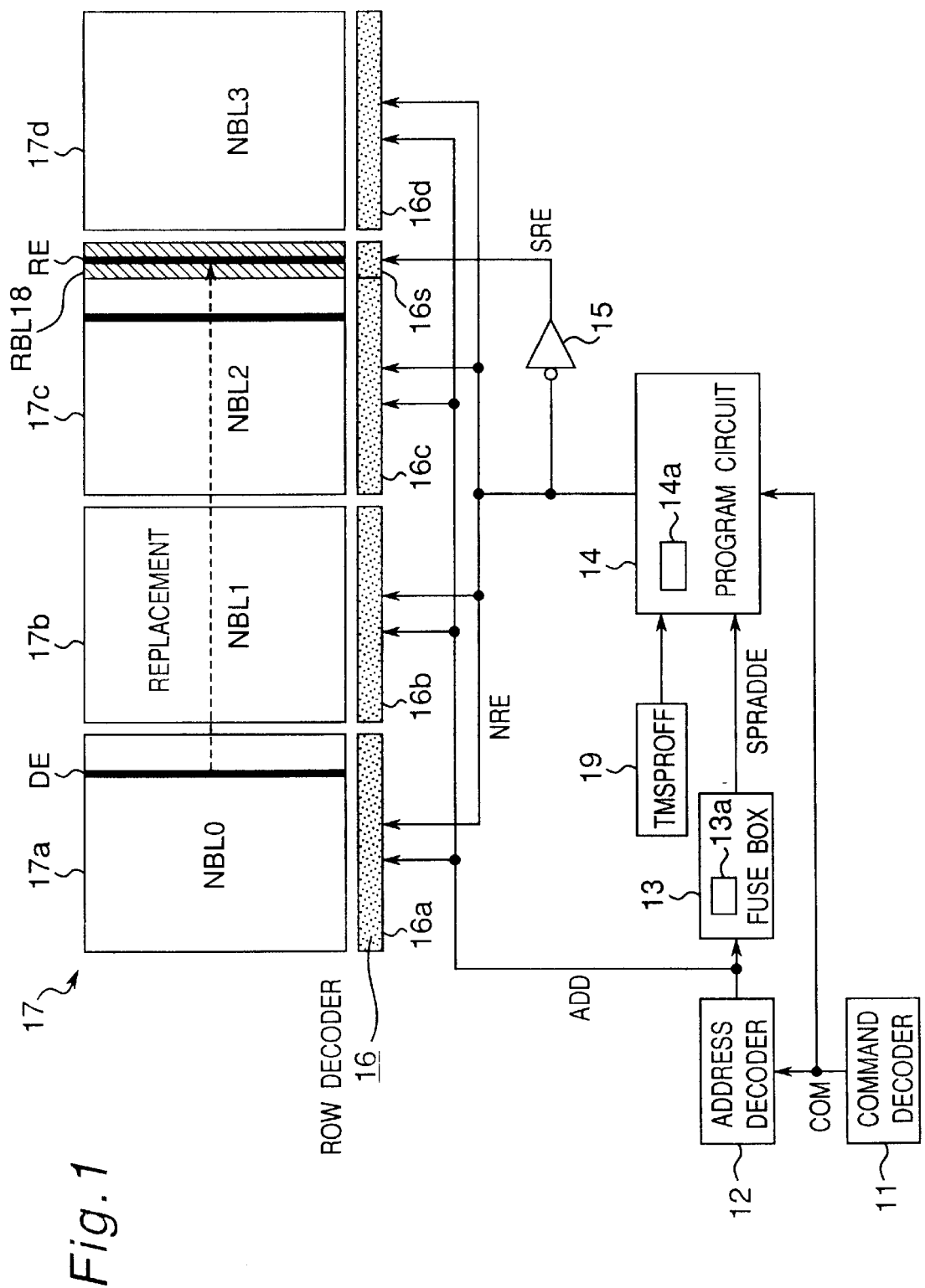
FIG. 1 is a schematic block diagram showing an entire structure of a semiconductor memory device according to a first embodiment of the present invention.

The first embodiment of the present invention will be described below with reference to FIGS. 1 to 4. FIG. 1 is a schematic diagram showing an entire constitution of a semiconductor memory device having a configuration for implementing a disturb test of a flexible redundancy type.

As shown in FIG. 1, the semiconductor memory device includes a command decoder 11, an address decoder 12, a fuse box 13, a program circuit 14, an inverter 15, a row decoder 16, and a memory cell array 17. The row decoder 16 includes a plurality of row decoder blocks 16a to 16d and 16s corresponding to a plurality of sub array blocks 17a to 17d. The sub array blocks 17a to 17d include corresponding normal blocks NBL0 to NBL3 each formed of normal memory cells. The spare row decoder block 16s corresponds to a redundant block (i.e., redundant circuit RBL) 18.

In this example, the explanation is made in the case where the first sub array block 17a contains a defective element DE and the only third sub array block 17c includes the redundant block (RBL) 18 of a redundancy concentrated type having redundant elements RE for replacement. Each memory cell in the normal block (NBL0 to NBL3) is connected to a corresponding word line WL, and each redundant cell in the redundant block (RBL) 18 is connected to a corresponding spare word line SWL. Thus, replacement of the defective element is performed with a redundant element RE over the different sub array blocks.

Each of the sub array block includes a plurality of memory cells arranged in rows and columns, where the word lines are arranged corresponding to the rows, and the bit lines are arranged corresponding to the columns.

In this embodiment, a specific feature resides in that a spare non-selection mode unit 19 is provided for enabling an operation using a previous or original address of the defective element in the state before executing a replacement (referred to as "pre-replacement" hereinafter) to thereby implement a disturb test even after the replacement.

In the construction as show in FIG. 1, the semiconductor receives various external signals such as an external row address strobe signal /RAS, external column address strobe signal /CAS, external chip select signal /CS, external write enable signal /WE, external clock signal CLK, and external clock enable signal CKE (although these are not shown). In response to the external signals, the command decoder 11 generates a command signal COM which is supplied both to the address decoder 12 and to the program circuit 14. In response to the command signal COM, the address decoder 12 generates an address signal ADD which is supplied to the fuse box 13 and also supplied to the first to fourth row decoder blocks 16a to 16d of the row decoder at the same time.

Then, the fuse box 13 generates a spare row address enable signal SPRADDE having replacement destination address information for the normal replacement operation mode. The spare row address enable signal SPRADDE is supplied to the program circuit 14 for designating a replacement destination address of the redundant block RBL 18.

In response thereto, the program circuit 14 generates a normal row enable signal NRE which is supplied to the inverter and also supplied to the first to fourth row decoder blocks 16a to 16d for selecting the normal blocks NBL0 to NBL3. The inverter 15, in response to the normal row enable signal NRE, generates a spare row enable signal SRE, which is supplied to the spare row decoder 16s for selecting a redundant element RE in the redundant block RBL 18 located in the third sub array block 17c.

In this construction, the spare non-selection mode unit 19 for a particular test mode is further provided to generate a spare row off mode signal TMSPROFF which is supplied to the program circuit 14 for enabling an operation using a previous or original address of the pre-replacement, thereby allowing a disturb test even after the replacement.

As shown in FIG. 1, in response to the spare row off mode signal TMSPROFF, the program circuit 14 disregards the spare row address enable signal SPRADDE. That is, by adding the spare row off mode signal TMSPROFF, the spare row address for a replacement destination is inactivated so that an original row address of the pre-replacement element DE in the first normal block NBL0 is activated to be recovered.

In a preferred embodiment, the program circuit 14 may be provided with a test mode detecting unit 14a for detecting designation of a particular test mode in response to a test mode designation signal (TMSPROFF) and the fuse box 13 may be provided with a determining unit 13a for determining use/non-use of redundancy in response to an address signal.

Figure 2:
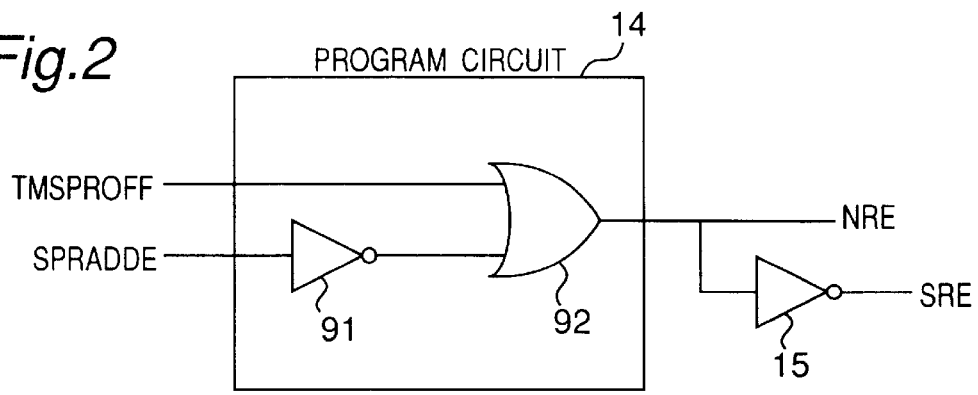
FIG. 2 is a schematic circuit diagram showing a construction of a program circuit.

FIG. 2 shows an example of constructing the program circuit 14 which includes an inverter 91 and an OR circuit 92. The spare row address enable signal SPRADDE output of the fuse box 13 is applied to an input terminal of the inverter 91 and the output signal thereof is applied to one of the input terminals of the OR circuit 92. The spare row off mode signal TMSPROFF is applied to the other input terminal of the OR circuit 92 which generates the normal row enable signal NRE as the output signal of the program circuit 14. Then, a spare row enable signal SRE is outputted via the inverter 15 upon receipt of the normal row enable signal NRE.

In this example, in the normal replacement operation, the defective element DE located in the first normal block NBL0 of the first sub array block 17a is replaced with a redundant element RE in the redundant block RBL 18 located in the third sub array block 16c. The replacement is carried out by blowing a fuse for a corresponding address in the fuse box 13 by means of a laser trimming method or by applying an electrical stress after assembling process.

Figure 3:
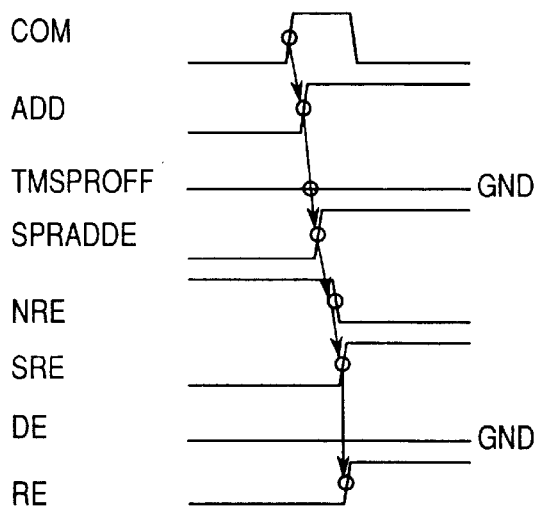
FIG. 3 is a timing chart showing a normal replacement operation according to the first embodiment of the present invention.

FIG. 3 shows a timing chart of a normal replacement operation in which a redundant element RE is selected for replacement in the spare address selection mode. In this normal replacement operation, when an external command is applied to select the defective element DE, the spare row address enable signal SPRADDE is supplied to the program circuit 14 from the fuse box and the spare row enable signal SRE outputted via the inverter 15 is enabled to thereby activate the redundant element RE. Thus, the redundant element RE included in the redundant block RBL 18 is, in fact, operated instead of the defective element DE included in the first normal block NBL0.

As shown in FIG. 3, when the command decoder 11 generates a command signal COM in response to the external signals, the address signal ADD of "H" level is supplied from the address decoder 12 to the fuse box 13 and also supplied to the first to fourth row decoder blocks 16a to 16d.

In the normal operation mode, the spare row off mode signal TMSPROFF is all the time kept in the "L" level (i.e., GND). In response to the address signal ADD of "H" level, the spare row address enable signal SPRADDE is raised to "H" in level. In response thereto, the normal row enable signal NRE output of the program circuit 14 is changed to "L" in level, and the spare row enable signal SRE output of the inverter 15 is changed to "H" in level. Thus, the row decoder blocks 16a to 16d remain in the inactivated condition so that the address of the defective element DE is in the non-selection state (i.e., inactivated condition). On the other hand, the redundant element RE in the redundant block RBL 18 is selected by activating the spare row decode block 16s at the rising edge of the spare row enable signal SRE.

However, if this normal replacement mode continues in state as it is, the original address signal for the replaced element DE can not be enabled. As a result, a defect such as a short-circuit to the adjacent cell of interest can not be detected or detection ability is undesirably lowered as explained in the prior art description.

In order to restore the original address of the previously replaced defective element DE, the particular test mode unit 19 is further provided to enter the spare row off mode for disabling the spare row address selection mode based on the spare row off mode signal TMSPROFF, thereby disregarding the spare row address enable signal SPRADDE.

Figure 4:
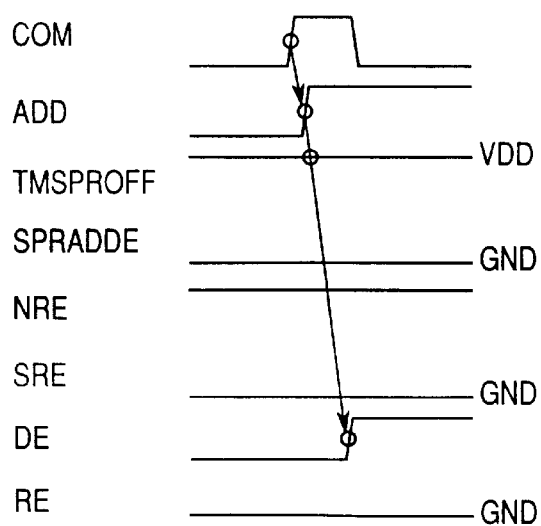
FIG. 4 is a timing chart showing a particular test mode operation according to the first embodiment of the present invention.

FIG. 4 shows a timing chart of a particular test mode operation in which an original element DE of the pre-replacement can be activated for carrying out the disturb test. In this particular test mode, when an external command is applied to select the defective element DE, the command decoder 11 generates a command signal COM in response to the external signals, and the address signal ADD of "H" level is supplied from the address decoder 12 to the fuse box 13 and also supplied to the first to fourth row decoder blocks 16a to 16d.

In the particular test mode, the spare row off mode signal TMSPROFF is all the time kept in the "H" level (i.e., VDD), disregarding the spare row address enable signal SPRADDE to be kept in "L" level (i.e., GND). The normal row enable signal NRE output of the program circuit 14 is all the time kept in "H" level, and the spare row enable signal SRE output of the inverter 15 is all the time kept in "L" level (i.e., GND).

Thus, in response to the address signal ADD of "H" level, the row decoder blocks 16a to 16d are activated so that the address of the defective element DE is restored to the selection state (i.e., activated condition).

On the other hand, the redundant element RE in the redundant block RBL 18 remains in the non-selection state by inactivating the spare row decode block 16s based on the "L" level of the spare row enable signal SRE. Thus, the pre-replacement address of the original element DE can be selected so that the defective portion of such as a memory cell adjacent to the original element DE can be detected even after executing the replacement (referred to as "post-replacement" hereinafter).

By adding the spare row off mode TMSPROFF, the original address of the pre-replacement defective element of interest can be selected. Therefore, the disturb test can be fully executed for detecting a defective portion, and the disturb test time can be suppressed to increase the speed of the disturb test.

It is noted here that the replaced defective element DE can be selected even when the defective portion is on the X line thereof. In this case, although the cell data of the defective element DE can not be sense-amplified, the bit line thereof can be determined by writing data in a page mode.

Embodiment 2

Figure 5:
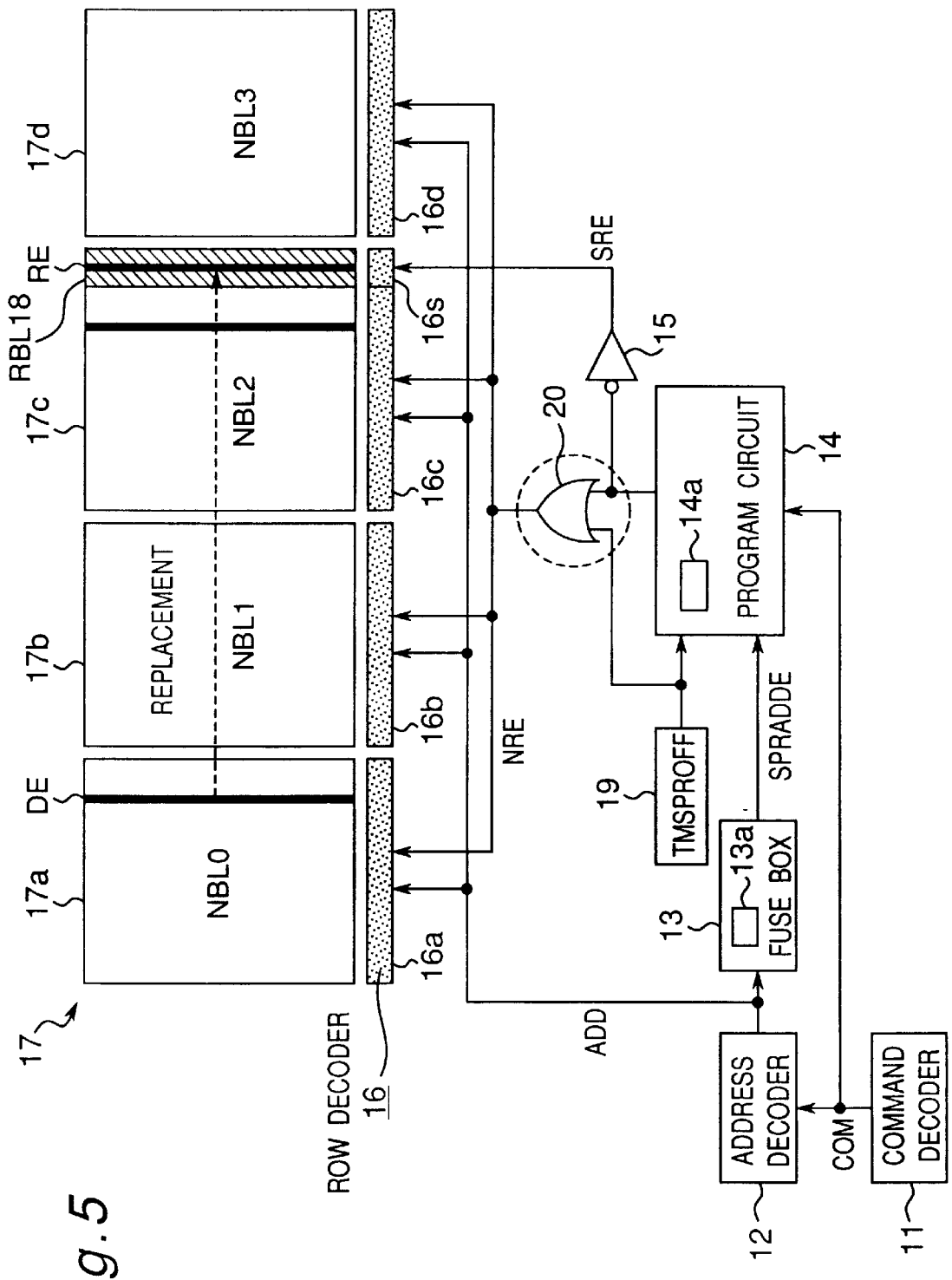
FIG. 5 is a schematic block diagram showing an entire structure of a semiconductor memory device according to a second embodiment of the present invention.

The second embodiment of the present invention will be described below with reference to FIGS. 5 and 6. FIG. 5 is a schematic diagram showing an entire constitution of a semiconductor memory device having a configuration for implementing a disturb test of a flexible redundancy type. The construction of the second embodiment shown in FIG. 5 is similar to that in the first embodiment shown in FIG. 1 except for providing an OR circuit 20.

As shown in FIG. 5, the semiconductor memory device includes the OR circuit 20 between the program circuit 14 and the row decoder 16, allowing to execute a disturb test both in the normal address selection mode and the spare address selection mode. The OR circuit 20 is provided in order to control multi-selection because the multi-selection is caused when the spare address selection mode is used.

In this construction, the output signal of the program circuit 14 is supplied to one of the input terminals of the OR circuit 20 and also supplied to the inverter 15. On the other hand, the spare non-selection mode unit 19 for a particular test mode generates the spare row off mode signal TMSPROFF which is supplied in common to the other input terminal of the OR circuit 20 and to the program circuit 14 for enabling an operation of an original address of the pre-replacement. Thus, the disturb test can be implemented both in the normal address selection mode and the spare address selection mode even after the replacement is carried out.

By this arrangement, the OR circuit 20 generates a normal row enable signal NRE which is supplied to the inverter and in common to the first to fourth row decoder blocks 16a to 16d for selecting the normal blocks NBL0 to NBL3. The inverter 15 generates a spare row enable signal SRE, which is supplied to the spare row decoder 16s for selecting a redundant element RE in the redundant block RBL 18 located in the third sub array block 17c.

In the particular test mode, upon receipt of the spare row off mode signal TMSPROFF, the program circuit 14 disregards the spare row address enable signal SPRADDE. That is, by adding the spare row off mode signal TMSPROFF, the spare row address for a replacement destination of the redundant element is changed to an original row address of the normal block to be restored and the restored original row address is activated.

In this example, Table 1 shows a relationship in signal level between the normal row enable signal NRE and the spare row enable signal SRE in response to the spare row off mode signal TMSPROFF and the spare row address enable signal SPRADDE.

TABLE 1

| TMSPROFF | SPRADDE | SRE | NRE |
| --- | --- | --- | --- |
| 0 | 0 | 0 | 1 |
| 0 | 1 | 1 | 0 |
| 1 | 0 | 0 | 1 |
| 1 | 1 | 1 | 1 |

(In table 1, "0" denotes a "L" level, and "1" denotes a "H" level.)

In this example, the original element DE of the pre-replacement and the redundant element RE of the post-replacement are both activated, thereby allowing to carry out the disturb test both in the normal address selection mode and in the spare address selection mode.

Figure 6:
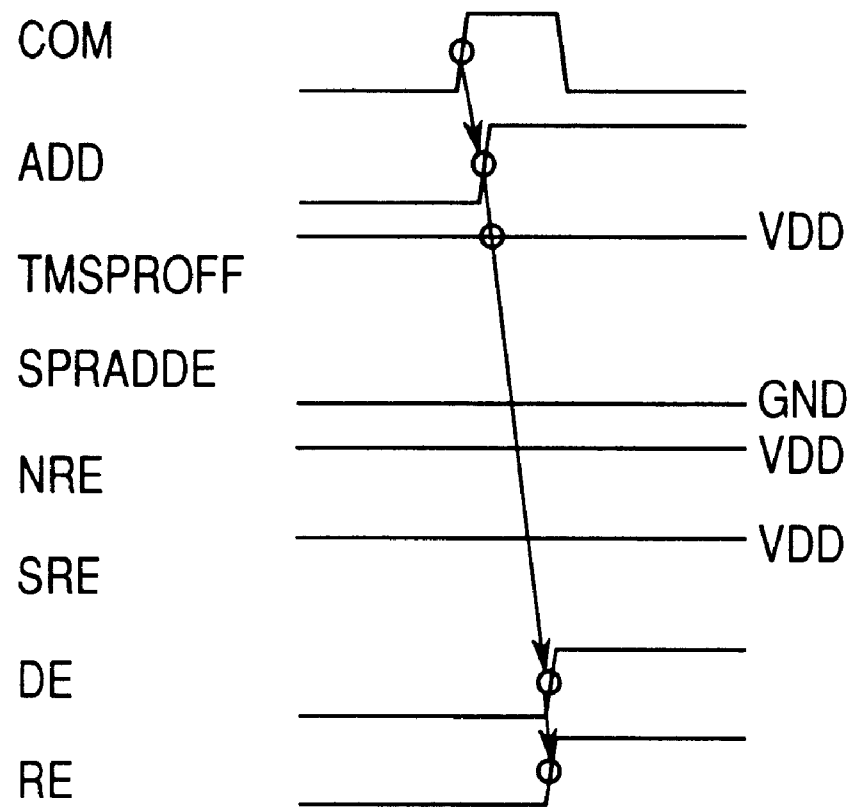
FIG. 6 is a timing chart showing a particular test mode operation according to the second embodiment of the present invention.

FIG. 6 shows a timing chart of a particular test mode operation in which the original element DE of the replacement and the replaced redundant element RE can be both activated for carrying out the disturb test. In this particular test mode, when the command decoder 11 generates a command signal COM in response to the external signals, the address signal ADD of "H" level is supplied from the address decoder 12 to the fuse box 13 and in common to the first to fourth row decoder blocks 16a to 16d.

In the particular test mode, the spare row off mode signal TMSPROFF is all the time kept in the "H" level (i.e., VDD), disregarding the spare row address enable signal SPRADDE to be kept in "L" level (i.e., GND). The normal row enable signal NRE output of the OR circuit 20 is all the time kept in "H" level. When the redundant block RBL 18 is selected for use, the spare row enable signal SRE output of the inverter 15 is all the time kept in "H" level (i.e., VDD).

Thus, in response to the address signal ADD of "H" level, the row decoder blocks 16a to 16d are activated so that the address of the defective element DE is changed to the selection state (i.e., activated condition). Also, the redundant element RE in the redundant block RBL 18 is changed to the selection state by activating the spare row decode block 16s based on the "H" level of the spare row enable signal SRE.

Thus, the previous address of the original element DE and the replaced redundant element RE can be both activated so that the defective portion of such as a memory cell adjacent to the original element DE can be both detected even after executing the replacement. By this arrangement, the disturb test time can be remarkably suppressed.

Embodiment 3

Figure 7:
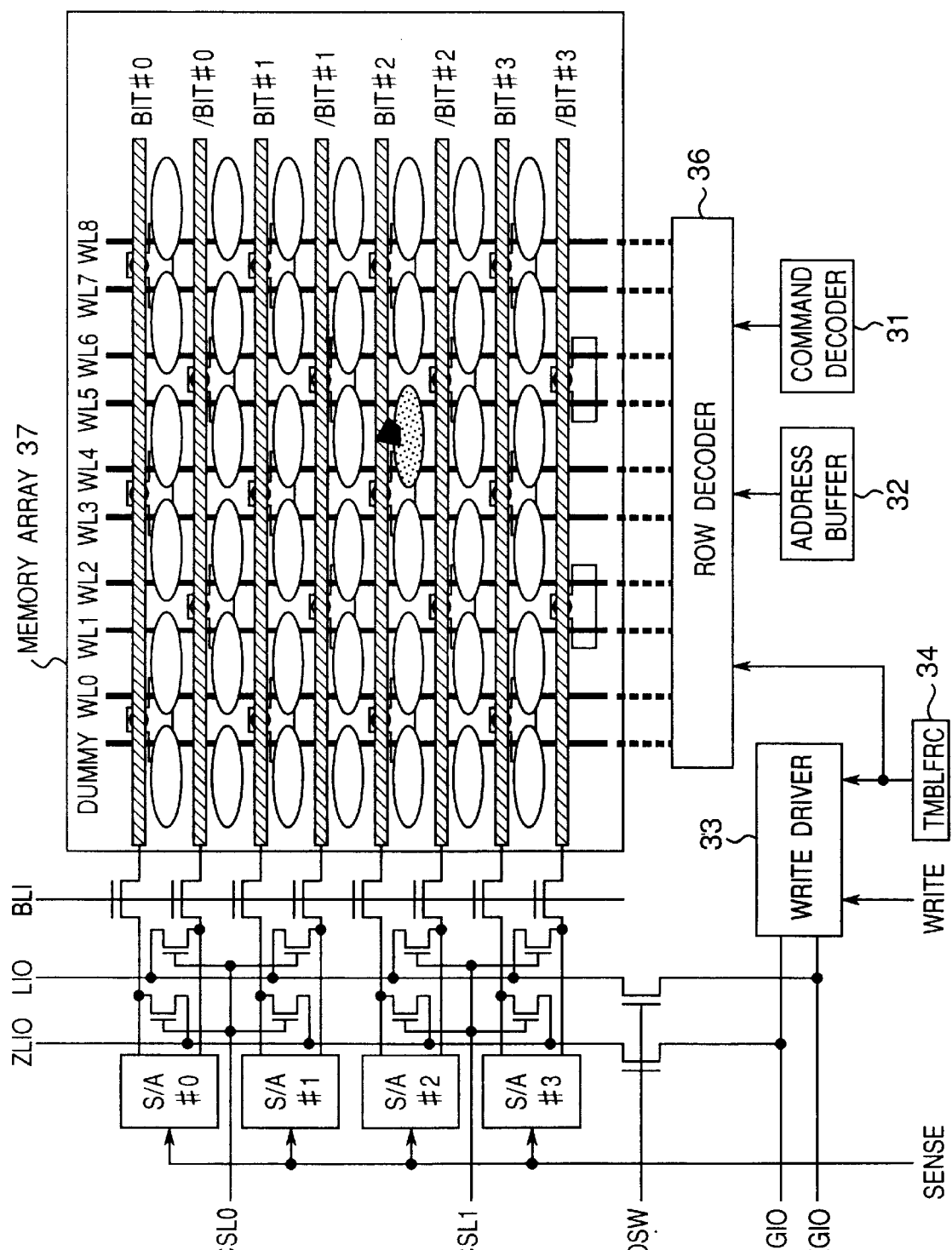
FIG. 7 is a schematic diagram showing an entire structure of a semiconductor memory device according to a third embodiment of the present invention.
Figure 8:
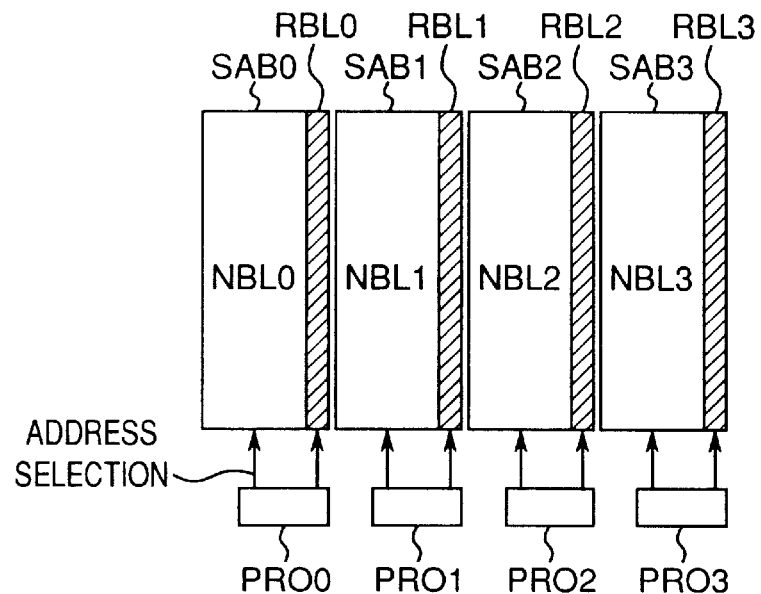
FIG. 8 is a schematic diagram showing an example of a conventional construction of a memory cell array.
Figure 9:
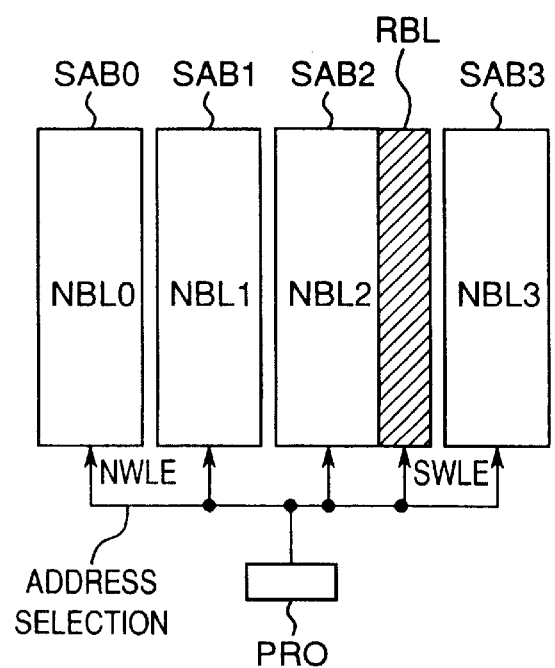
FIG. 9 is a schematic diagram showing another example of a conventional construction of a memory cell array.
Figure 10:
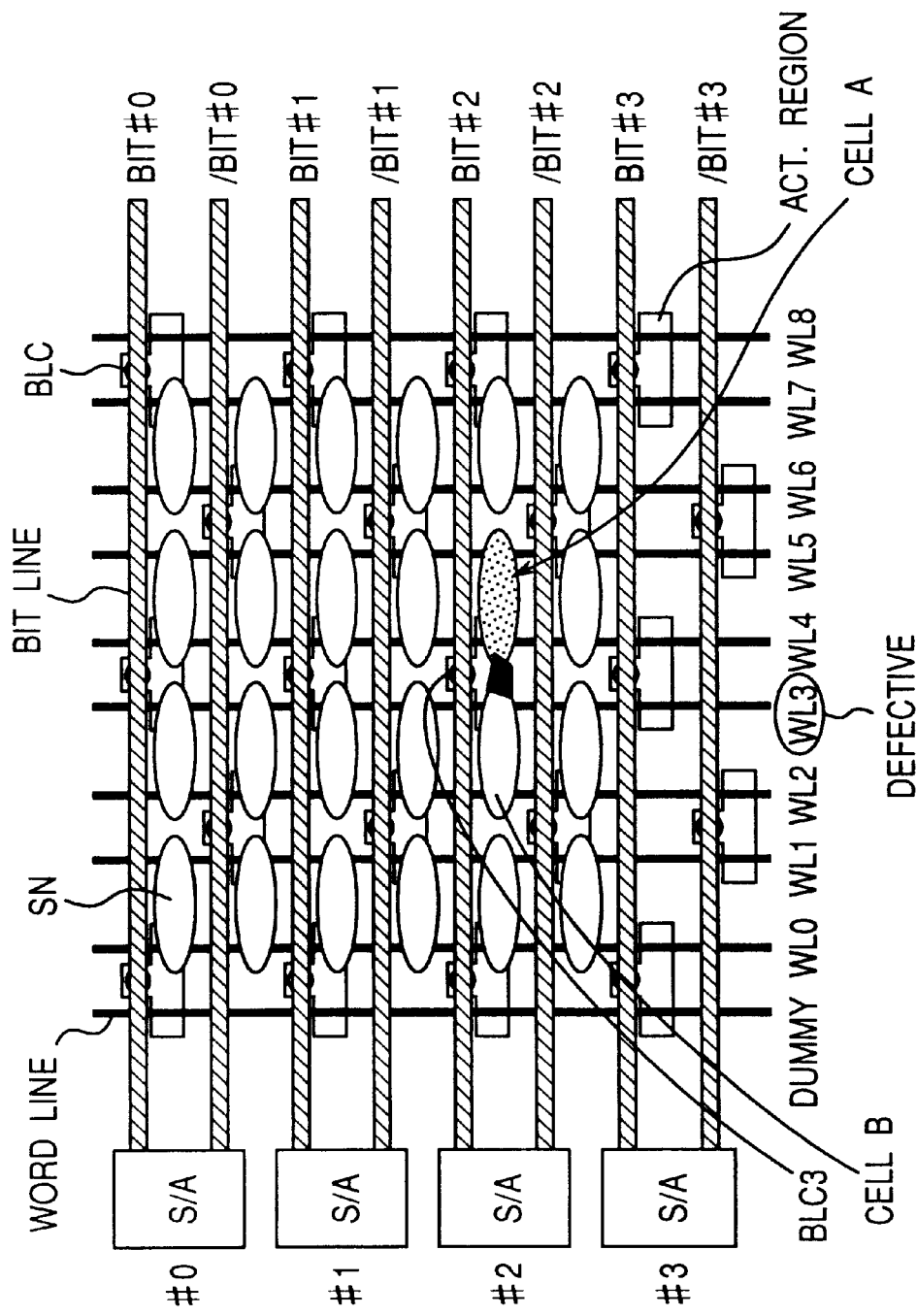
FIG. 10 is a plan view showing an example of a conventional memory cell array of DRAM.

The third embodiment of the present invention will be described below with reference to FIG. 7. FIG. 7 shows an entire configuration of the semiconductor memory device adapted to implement a disturb test of a flexible redundancy type by adding a bit line voltage force mode (TMBLFRC mode) for determining a voltage potential of a bit line while a word line is kept in an off-state. This is based on a concept that activation of a word line is not necessary in the disturb test mode so long as a bit line of interest of the subject sub array block can be written with an external long row address strobe signal /RAS.

Figure 11:
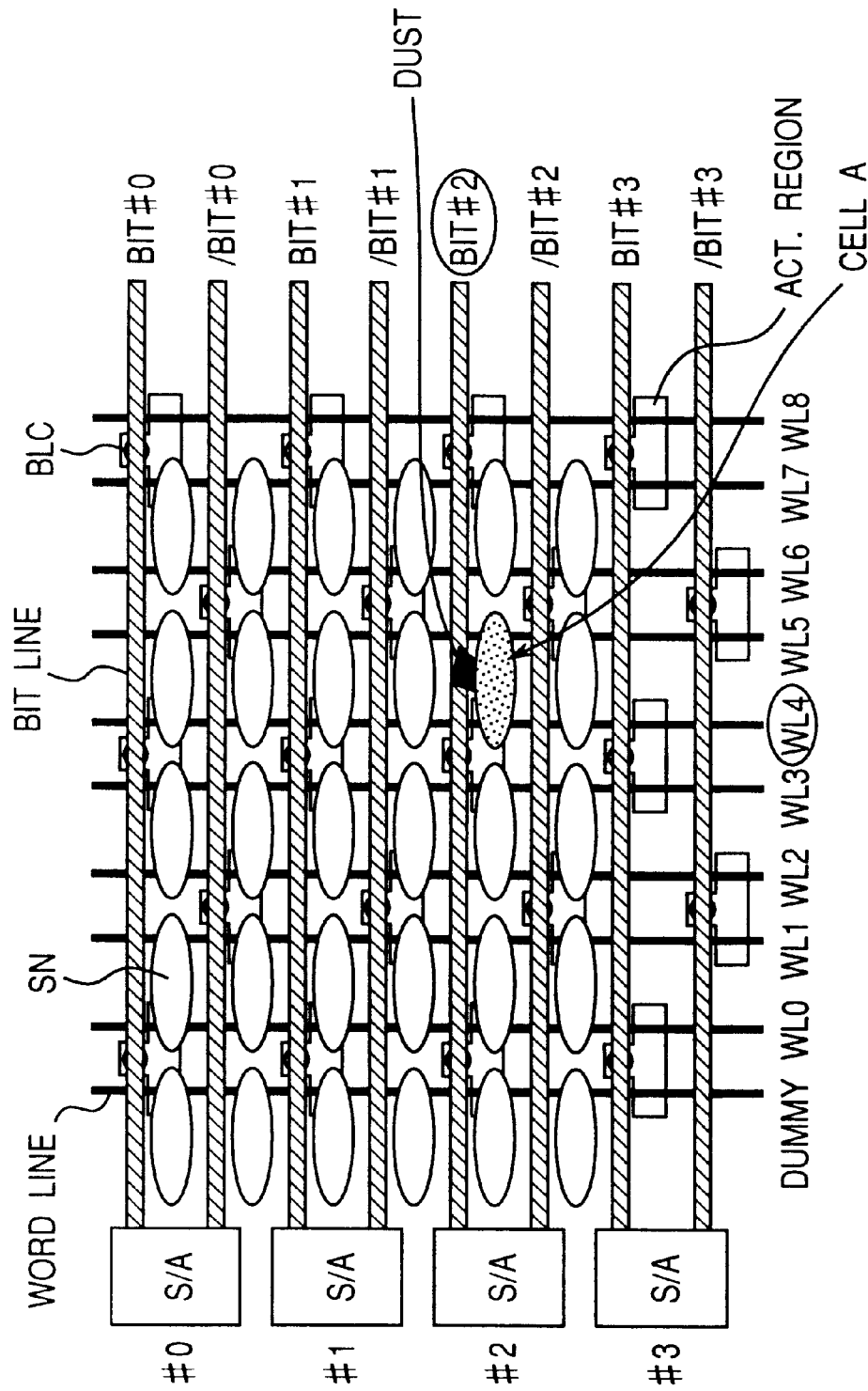
FIG. 11 is a plan view showing another example of a conventional memory cell array of DRAM.

As shown in FIG. 7, the semiconductor memory device includes a command decoder 31, an address buffer 32, a write driver 33, a bit line voltage force mode setting unit 34, a row decoder 36, and a memory cell array 37 which is similar to that shown in FIG. 11.

In this construction, a plurality of sense amplifiers (S/A0, . . . , S/A3) are connected to corresponding bit line pairs (Bit#0, /Bit#0, . . . , Bit#3, /Bit#3), respectively, via local switching units and bit line isolation units, and each of the bit lines has a plurality of activation regions through bit line contacts BLC. The memory cell array 37 further includes a plurality of word lines (WL0 to WL8) so that interest storage nodes SN of the memory cells are designated by the bit lines and the word lines.

In this example, the bit line level is given via the write driver 33 to thereby allowing the disturb test. A sense amplifier enable signal SENSE is supplied to the sense amplifiers (S/A0, . . . , S/A3). A write enable signal WRITE and a bit line voltage force mode signal TMBLFRC are supplied to the write driver 33. The outputs of the write driver 33 are controlled by an IO switch signal IOSW and global IO signals GIO and ZGIO. The local switching units are controlled by local IO signals LIO and ZLIO and the bit line isolation units are controlled by a bit line isolation signal BLI. Thus, the bit line level in voltage potential is determined via the outputs of the write driver 33 based on column select line signals CSL0 to CSL1.

The IO switch signal IOSW is a control signal for effecting an ON/OFF control in accordance with an address to be accessed. The bit line isolation signal BLI is a transistor control signal for isolating an sense amplifier from a corresponding bit line connected to a corresponding memory cell, and the bit line isolation signal BLI is turned on (i.e., "H" level) when accessing the memory cell.

The bit line voltage force mode signal TMBLFRC is also supplied to the row decoder 16 in order to inactivate the word line to be kept in off-state. When the bit line voltage force mode signal TMBLFRC is applied, the sense amplifier enable signal SENSE is set to "L" level so that the sense amplifiers (S/A0, . . . , S/A3) are inactivated. Then, the outputs of the write driver 33 determines the bit line level in combination with the global IO signals GIO and ZGIO.

In this example, the following describes a case where there is a short-circuit between a storage node of the cell A and an adjacent bit line (e.g., Bit #2) due to such as a conductive foreign substance or dusts.

In order to detect this defect, expected data of high level "H" is firstly written in the cell A. Then, the program enters a particular test mode by applying the bit line voltage force mode signal TMBLFRC. When the particular test mode is entered, the sense amplifier enable signal SENSE is made "L" in level so that the sense amplifiers are inactivated. Then, in accordance with the output signals of the write driver 33 in combination with the global IO signal GIO and local IO signal LIO, the level of the bit line of interest is determined. In this example, the level of the bit line Bit #2 is determined in a manner such that the adjacent cell can be written with reverse data with respect to the data in the cell. By this arrangement, the defect can be detected in the disturb test in the particular test mode.

Although a paired bit lines Bit #n and /Bit #n can be given with only data reverse to each other in level in the normal test operation, the third embodiment allows an optional combination of bit line pair such as Bit 0=H, /Bit 0=H and Bit 1=L, /Bit 1=L. That is, in order to attain an optional combination of bit line pair, the same data is written in the global IO (GIO and ZGIO) from the write driver 33 and the obtained global IO signals are sent to a bit line of interest in accordance with the activated address of the column select line (CSL).

By this arrangement of the particular test mode, it becomes possible to apply reverse data to both sides of the bit line pair with respect to the subject memory cell, although only one side of the bit line pair can be applied with reverse data in the conventional normal test mode. That is, by adding the bit line voltage force mode (TMBLFRC mode), the normal block with the designated address and a spare block are both selected to connect the global IO (GIO) with the local IO (LIO). Thus, the disturb test can be remarkably accelerated to reduce the test time.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A semiconductor memory device comprising:
   normal circuit blocks having a plurality of memory cells;
   a redundant circuit block having a plurality of redundant memory cells for replacement during a replacement operation of defective normal memory cells in the normal circuit blocks;
   memory operation circuitry configured to activate the normal circuit blocks and the redundant circuit block for respective cell addresses in a normal mode;
   test mode executing circuitry configured to cause the memory operation circuitry to activate in a test mode the normal circuit blocks and the defective normal memory cells in a state prior to executing the replacement operation; and logical circuitry configured to activate in the test mode, the normal circuit blocks, the defective normal memory cells, and the redundant circuit block.

2. The semiconductor memory device according to claim 1, wherein said test mode executing unit is further configured to set a spare non-selection mode for prohibiting usage of a redundant circuit.

3. The semiconductor memory device according to claim 1 wherein the memory operation circuitry further comprises a determining circuit for determining a state of use of the redundant circuit block in response to an address signal.

4. The semiconductor memory device according to claim 1, wherein said test mode executing circuitry further comprises a test mode detecting circuit for detecting designation of a particular test mode in response to a test mode designation signal.

* * * * *